(12) United States Patent
Kawamoto

(10) Patent No.: US 6,762,461 B2
(45) Date of Patent: Jul. 13, 2004

(54) SEMICONDUCTOR ELEMENT PROTECTED WITH A PLURALITY OF ZENER DIODES

(75) Inventor: Atsunobu Kawamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/314,154

(22) Filed: Dec. 9, 2002

(65) Prior Publication Data

US 2004/0012052 A1 Jan. 22, 2004

(30) Foreign Application Priority Data

Jul. 19, 2002 (JP) ........................................ 2002-210767

(51) Int. Cl.[7] .............................................. H01L 23/62
(52) U.S. Cl. ...................... 257/358; 257/356; 257/550; 257/551; 257/175
(58) Field of Search ................................ 257/173, 175, 257/328, 358, 355, 356, 530, 550, 551

(56) References Cited

U.S. PATENT DOCUMENTS 6,229,180 B1 * 5/2001 Yoshida et al. ............. 257/355
6,441,463 B2 8/2002 Yasuda ....................... 257/533

FOREIGN PATENT DOCUMENTS

| JP | 6-342915 | 12/1994 |
| JP | 11-220129 | 8/1999 |
| JP | 2002-16254 | 1/2002 |

* cited by examiner

Primary Examiner—Nathan J. Flynn
Assistant Examiner—Thomas L Dickey
(74) Attorney, Agent, or Firm—Oblon, Spivak, McClelland, Maier & Neustadt, P.C.

(57) ABSTRACT

A protective circuit for protecting an IGBT from a stress due to application of an overvoltage which is induced by a surge such as static electricity is provided. The protective circuit allows for improvement in a voltage tolerance to a stress due to application of an overvoltage induced by a surge while ensuring a current tolerance to flow of a direct current from an external power supply when the external power supply is improperly connected in a direction contrary to a normal direction. The protective circuit includes a resistor having one end connected to a terminal for connecting to the external power supply and the other end connected to a semiconductor element, and a first zener diode including a cathode connected to the other end of the resistor. The protective circuit further includes a plurality of second zener diodes connected in series between the one end of the resistor and a generator of a constant potential such as a ground.

4 Claims, 7 Drawing Sheets

SEMICONDUCTOR ELEMENT PROTECTED WITH A PLURALITY OF ZENER DIODES

BACKGROUND OF THE INVENTION

1. Field of the Invention

The present invention relates to a semiconductor device including a protective circuit, and more particularly to a semiconductor device including a protective circuit for preventing breakdown of an insulated gate bipolar transistor which is caused by a stress due to flow of an overcurrent or application of an overvoltage, for example.

2. Description of the Background Art

There has conventionally been a protective circuit which is formed in the same semiconductor device that includes an IGBT (Insulated Gate bipolar Transistor) and functions to protect the IGBT from a stress due to flow of an overcurrent or application of an overvoltage. FIGS. 11 through 13 illustrate such a conventional protective circuit.

FIG. 11 is a circuit diagram of the conventional protective circuit. FIG. 12 is a sectional view of a portion of a semiconductor device in which the conventional protective circuit is formed. FIG. 13 is a plan view of the portion of the semiconductor device illustrated in FIG. 12. The sectional view of FIG. 12 is taken along a line XII—XII of FIG. 13.

In the conventional protective circuit illustrated in FIG. 11, a terminal P for establishing connection with an external power supply (which will be hereinafter referred to as an "external connection terminal") is connected to one end of a resistor R1, the other end of which is connected to a cathode of a first zener diode D1 and a semiconductor element such as an IGBT not shown. An anode of the first zener diode D1 is connected to any kind of a constant potential node such as a ground.

Next, a structure of the semiconductor device in which the conventional protective circuit illustrated in FIG. 11 is formed will be described with reference to the sectional view of the semiconductor device in FIG. 12.

An $n^+$-type semiconductor layer 2 is formed on a p-type semiconductor substrate 1 by using epitaxial growth. On the $n^+$-type semiconductor layer 2, an $n^-$-type semiconductor layer 3 is formed by using epitaxial growth. An oxide film 4 is formed on the $n^-$-type semiconductor layer 3, and a polysilicon region is provided in a portion of the oxide film 4. A p-type diffusion layer 5 and an $n^+$-type diffusion layer 6 are formed in respective predetermined portions of the polysilicon region by diffusing impurities into the corresponding portions.

Further, an insulating film 7 is formed so as to cover respective top faces of the oxide film 4, the p-type diffusion layer 5 and the $n^+$-type diffusion layer 6. Contact holes extending from a surface of the insulating film 7 and respectively reaching the diffusion layers 5 and 6 are formed in respective predetermined portions of the insulating film 7. Each of interconnects 8 and the external connection terminal P is formed by filling each of the contact holes with a conductor such as a metal in a predetermined pattern.

Moreover, an electrode 10 used for an IGBT or the like is formed on a back face of the p-type semiconductor substrate 1.

In the semiconductor device with the foregoing structure, a junction between the p-type diffusion layer 5 and the $n^+$-type diffusion layer 6 forms the first zener diode D1, while the $n^+$-type diffusion layer 6 which connects one of the interconnects 8 and the external connection terminal P forms the resistor R1.

The one of the interconnects 8 which is connected to the $n^+$-type diffusion layer 6 is to be connected to the IGBT, while another one of the interconnects 8 which is connected to the p-type diffusion layer 5 is to be connected to a constant potential node.

FIG. 13 is a plan view of the foregoing configuration, in which the insulating film 7 covering the diffusion layers 5 and 6 are omitted for purposes of clarifying the formation of the first zener diode D1 and the resistor R1.

In the protective circuit with the above-mentioned configuration, the first zener diode D1 is formed in order to protect the IGBT from a stress due to application of an overvoltage which is induced by a surge such as static electricity externally supplied.

More specifically, upon application of an overvoltage which is induced by a surge such as static electricity via the external connection terminal P, a zener breakdown takes place in the first zener diode D1, to absorb the overvoltage induced by a surge as applied. This prevents a voltage equal to or higher than a breakdown voltage from being applied to the IGBT. Accordingly, it is possible to prevent the IGBT from being broken down under a stress due to application of an overvoltage which is induced by a surge.

On the other hand, the resistor R1 is formed in order to protect the first zener diode D1 from a stress due to flow of an overcurrent from an external power supply.

More specifically, the resistor R1 is formed in order to provide for occurrence of an event where an external power supply Vd for driving the IGBT is improperly connected in a direction contrary to a normal direction as illustrated in FIG. 14. In such an event, even if a direct current I continues to flow from the external power supply Vd for a predetermined time, a value (flow rate) of the direct current I is limited to a degree where the first zener diode D1 is not broken, by the resistor R1.

As described above, according to the conventional protective circuit, the first zener diode D1 is formed in order to protect a semiconductor element such as an IGBT from a stress due to application of an overvoltage which is induced by a surge such as static electricity, and the resistor R1 is formed in order to protect the first zener diode D1 from a stress due to flow of an overcurrent which may possibly be caused by improper connection of the external power supply Vd.

However, if an overvoltage is applied to the conventional protective circuit including the resistor R1 and the first zener diode D1 as illustrated in FIG. 11 because of occurrence of a surge, a voltage difference which is equal to a difference between the applied overvoltage and a breakdown voltage is provided between opposite ends of the resistor R1.

As a result, an electric power is generated due to the voltage difference between the opposite ends of the resistor R1 so that the resistor R1 is excessively heated. Thus, if an overvoltage equal to or higher than a predetermined voltage is applied to the protective circuit because of occurrence of a surge, the resistor R1 is likely to be burnt and be disconnected from the protective circuit. Thus, because of the formation of the resistor R1 within the protective circuit, an entire voltage tolerance of the protective circuit to a stress due to application of an overvoltage induced by a surge is degraded.

In order to improve the voltage tolerance of the protective circuit including the resistor R1 to a stress due to application of an overvoltage induced by a surge, minimization of a resistance of the resistor R1 may be effective on one hand. However, on the other hand, minimization of a resistance of the resistor R1 would reduce a current (flow rate) tolerance of the protective circuit for protecting the first zener diode D1 from a stress due to flow of an overcurrent which is induced by improper connection of an external power supply. In view of this, there are limits to how much the voltage tolerance and the current tolerance can be improved, respectively.

SUMMARY OF THE INVENTION

It is an object of the present invention to provide a semiconductor device including a protective circuit capable of improving a voltage tolerance of the protective circuit while maintaining a predetermined current tolerance of the protective circuit.

According to the present invention, a semiconductor device with a semiconductor element formed on a semiconductor substrate and a protective circuit for the semiconductor element includes a resistor, a first zener diode and a plurality of second zener diodes. The resistor has one end connected to a terminal for external connection and the other end connected to the semiconductor element. The first zener diode is connected between the other end of the resistor and a constant potential node. The plurality of second zener diodes are connected in series between the one end of the resistor and the constant potential node. The number of the plurality of second zener diodes is larger than that of the first zener diode.

The number of the second zener diodes to be connected is controlled so as to allow a sum of forward rising voltages of the second zener diodes to be higher than a voltage of an external power supply connected with the terminal for external connection. This ensures that a current flowing from the external power supply flows into the resistor via the first zener diode thereby to advantageously reduce the current, not allowing the current to flow into the second zener diodes even if the external power supply is improperly connected in a direction contrary to a normal direction.

Accordingly, it is possible to prevent the first and second zener diodes from being broken due to flow of a current from the external power supply.

Also, even if an overvoltage is applied via the terminal for external connection because of occurrence of a surge such as static electricity, the opposite ends of the resistor are kept at respective constant potentials and an excessive voltage difference is not provided between the opposite ends of the resistor. Accordingly, the resistor is saved from burning due to application of an overvoltage induced by a surge.

Thus, it is possible to improve a voltage tolerance of the protective circuit while maintaining a current tolerance thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
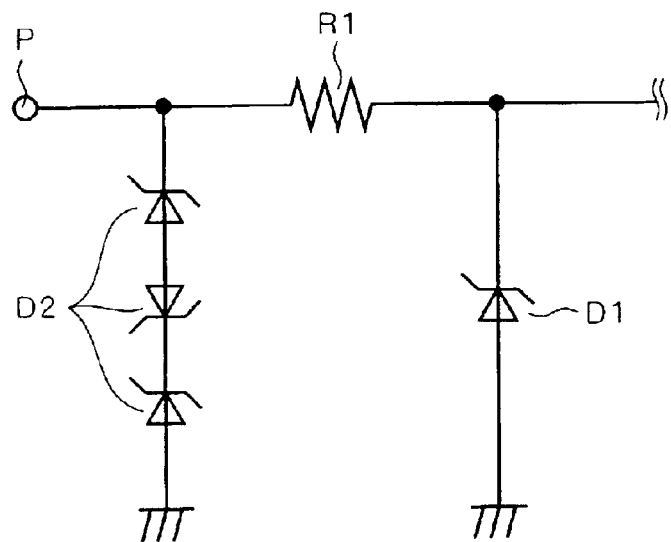
FIG. 1 is a circuit diagram of an example of a protective circuit according to the present invention.

Below, the present invention will be described in detail with reference to a preferred embodiment thereof as illustrated in the accompanying drawings. It is noted that the same reference numerals as in the background art section are used in the following description for denoting corresponding elements.

Preferred Embodiment

FIG. 1 is a circuit diagram illustrating one example of a protective circuit according to a present preferred embodiment.

In the protective circuit illustrated in FIG. 1, an external connection terminal P is connected to one end of a resistor R1, the other end of which is connected to a cathode of a first zener diode D1 and a semiconductor element such as an IGBT not shown. An anode of the first zener diode D1 is connected to any kind of a constant potential node such as a ground.

In the protective circuit according to the present preferred embodiment, the one end of the resistor R1 is further connected to plural stages of second zener diodes D2 connected in series (it is noted that though FIG. 1 illustrates three stages of second zener diodes D2, the number of the stages is not limited thereto).

Out of the plural stages of the second zener diodes D2, one second zener diode D2 which is connected to the resistor R1 at a position farthest from the resistor R1 is connected to the constant potential node such as a ground.

The plural stages of the second zener diodes D2 are connected in series such that every two adjacent ones of the second zener diodes D2 are connected in mutually opposed directions. In the present description, a direction toward the external connection terminal P from the constant potential node is defined as a "forward direction" while a direction reverse to the "forward direction" is defined as a "reverse direction".

Figure 2:
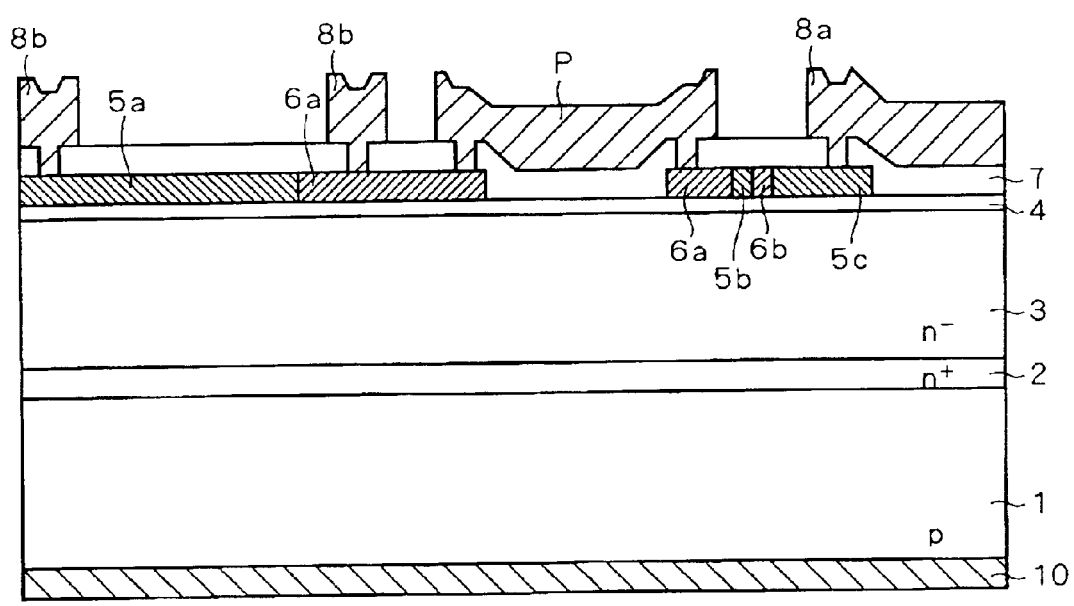
FIG. 2 is a sectional view illustrating of a portion of a semiconductor device in which the example illustrated in FIG. 1 of the protective circuit according to the present invention is formed.
Figure 3:
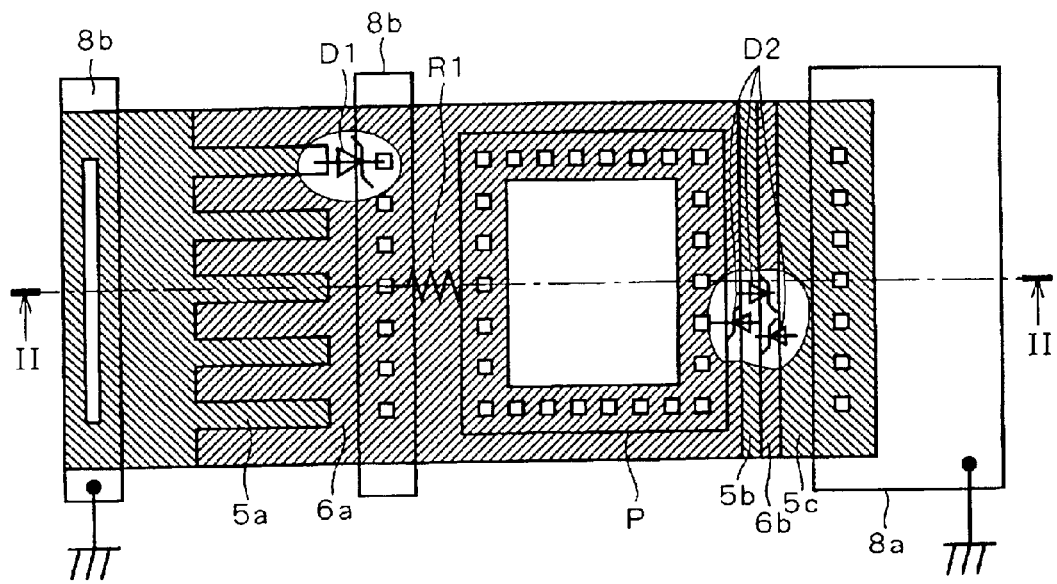
FIG. 3 is a plan view from above of the semiconductor device in which the example illustrated in FIG. 1 of the protective circuit according to the present invention is formed.

FIG. 2 is a sectional view illustrating a portion of a semiconductor device in which the protective circuit according to the present preferred embodiment illustrated in FIG. 1 and an IGBT are formed. FIG. 3 is a plan view from above of the portion of the semiconductor device illustrated in FIG. 2. The sectional view of FIG. 2 is taken along a line II—II of FIG. 3.

Referring to FIG. 2, an $n^+$-type semiconductor layer 2 is formed on a p-type semiconductor substrate 1 by using epitaxial growth. On the $n^+$-type semiconductor layer 2, an $n^-$-type semiconductor layer 3 is formed by using epitaxial growth.

An oxide film 4 is formed on the n—type semiconductor layer 3 so as to prevent electrical connection between the protective circuit to be formed above the semiconductor substrate 1 and the semiconductor substrate which forms a part of the IGBT. A polysilicon region is provided in a portion of the oxide film 4. P-type diffusion layers 5a, 5b and 5c and $n^+$-type diffusion layers 6a and 6b are readily formed in respective predetermined portions of the polysilicon region by diffusing impurities into the corresponding portions.

Further, an insulating film 7 is formed so as to cover respective top faces of the oxide film 4, the p-type diffusion layers 5a, 5b and 5c and the $n^+$-type diffusion layers 6a and 6b. Contact holes extending from a surface of the insulating film 7 and respectively reaching the diffusion layers 5a, 5b, 5c, 6a and 6b are formed in respective predetermined portions of the insulating film 7. Each of interconnects 8a and 8b and the external connection terminal P is formed by filling each of the contact holes with a conductor such as a metal in a predetermined pattern.

Moreover, an electrode 10 used for an IGBT or the like is formed on a back face of the p-type semiconductor substrate 1.

In the semiconductor device with the foregoing structure, a junction between the p-type diffusion layer 5a and the $n^+$-type diffusion layer 6a which are connected to respective ones of the interconnects 8b form the first zener diode D1, while the $n^+$-type diffusion layer 6a which is connected the one of the interconnects 8b and the external connection terminal P forms the resistor R1.

Between the $n^+$-type diffusion layer 6a which is connected to the external connection terminal P and the p-type diffusion layer 5c which is connected to the interconnect 8a, the p-type diffusion layer 5b and the $n^+$-type diffusion layer 6b are arranged in an alternate manner, to form a plurality of pn junctions. With the plurality of pn junctions, the plural stages of the second zener diodes D2, every two adjacent ones of which are connected in series in mutually opposed directions, are formed.

The one of the interconnects 8b which is connected to the $n^+$-type diffusion layer 6a is to be connected to the IGBT, while the one of the interconnects 8b and the interconnect 8a which are connected to the p-type diffusion layers 5a and 5c, respectively, are to be connected to the constant potential node.

FIG. 3 is a plan view illustrating a configuration of the foregoing protective circuit, in which the insulating film 7 covering the diffusion layers 5a, 5b, 5c, 6a and 6b are omitted for purposes of clarifying the formation of the first zener diode D1, the second zener diodes D2 and the resistor R1.

The diffusion layers 5a and 6a which form the first zener diode D1 are configured such that an interface therebetween is shaped like a comb as illustrated in FIG. 3. This configuration increases an area of a pn junction, so that a resistance to a current flowing through the first zener diode D1 can be reduced. Accordingly, by providing diffusion layers configured as noted above, it is possible to improve a current tolerance of the first zener diode D1.

Additionally, though FIG. 2 illustrates formation of the insulating film 7 below the external connection terminal P, the insulating film 7 may be replaced with the $n^+$-type diffusion layer 6a formed of the polysilicon region in which impurities are diffused.

Below, operations of the protective circuit with the foregoing configuration will be described.

Figure 4:
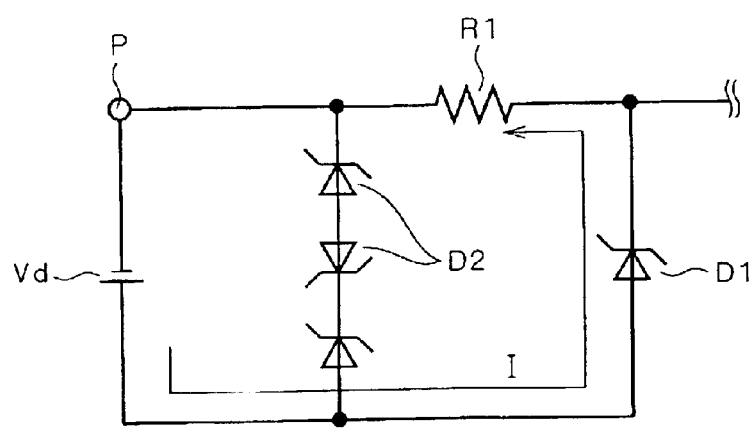
FIG. 4 is a circuit diagram for illustrating improper connection in which the protective circuit according to the present invention is connected with an external power supply in a direction contrary to a normal direction.

For example, assume that an external power supply Vd for driving the IGBT is improperly connected in a direction contrary to a normal direction as shown in FIG. 4. Under such a circumstance, if a sum of forward rising voltages (initial values of forward voltages at their rising) Vf2 of the plural stages of the second zener diodes D2 is higher than a voltage V of the external power supply Vd and a forward rising voltage (an initial value of a forward voltage at its rising) Vf1 of the first zener diode D1 is lower than the voltage V of the external power supply Vd, which is expressed as Vf1<V<Vf2, a direct current I supplied from the external power supply Vd flows into the resistor R1 via the first zener diode D1.

Accordingly, the direct current I does not flow through the second zener diodes D2. Hence, the second zener diodes D2 are saved from burning under a stress due to flow of an overcurrent.

Further, as for the first zener diode D1, a value (flow rate) of the direct current I is controlled by the presence of the resistor R1, to suppress a stress due to flow of the direct current I to be imposed on the first zener diode D1. Hence, also the first zener diode D1 is saved from burning.

Moreover, in the protective circuit illustrated in FIG. 1, even if an overvoltage is applied to the protective circuit via the external connection terminal P because of occurrence of a surge such as static electricity, it is possible to prevent the resistor R1 from being heated and burnt for the following reasons. In a state where an overvoltage is applied to the protective circuit because of occurrence of a surge, a difference between respective voltages applied to the opposite ends of the resistor R1 is equal to a value obtained by subtracting a reverse breakdown voltage Vz1 of the first zener diode D1 from a sum of reverse rising voltages (initial values of reverse voltages at their rising) Vz2 of the plural stages of the second zener diodes D2. As such, an amount of an electric power generated in the resistor R1 can be controlled based on the difference between the respective voltages applied to the opposite ends of the resistor R1 (=Vz2−Vz1). As a result, it is possible to also prevent the resistor R1 from being burnt due to heat generation therein.

As described above, the resistor R1 is connected to, as a stage preceding thereto, the plural stages of the second zener diodes D2 with the sum of their forward rising voltages Vf2 being higher than the voltage V of the external power supply Vd. Accordingly, even if the external power supply Vd is improperly connected in a direction contrary to a normal direction, the direct current I is not allowed to flow through the second zener diodes D2, but flows through the resistor R1 via the first zener diode D1. As a result, the current tolerance of the protective circuit can be maintained.

Further, even if a stress due to application of an overvoltage induced by a surge such as static electricity is imposed on the external connection terminal P, it only results in that a voltage equal to a difference between the sum of the reverse rising voltages Vz2 of the second zener diodes D2 and the reverse breakdown voltage Vz1 of the first zener diode D1 is applied to the resistor R1. Accordingly, the resistor R1 can be saved from burning, which improves the current tolerance of the protective circuit.

Moreover, the protective circuit according to the present invention includes the second zener diodes D2 which are connected in opposite directions. This makes it possible to improve the voltage tolerance of the protective circuit to not only a stress due to application of a positive overvoltage induced by a surge but also a stress due to application of a negative overvoltage induced by a surge.

Additionally, the number, as well as the respective directions of connection, of the second zener diodes D2 can be arbitrarily chosen so long as a requirement that the sum of the forward rising voltages Vf2 is higher than the voltage V of the external power supply Vd is satisfied.

Figure 5:
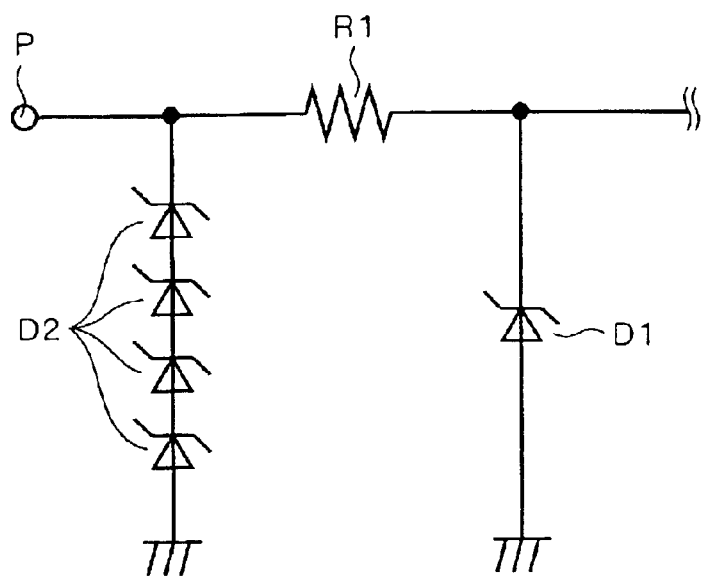
FIGS. 5 and 6 are circuit diagrams of other examples of the protective circuit according to the present invention.

For example, all of the second zener diodes D2 can be connected in series in the same forward direction as in a protective circuit illustrated in FIG. 5. Alternatively, plural pairs of zener diodes D3 connected to each other in mutually opposed directions, which pairs are connected in series can be provided in place of the second zener diodes D2, as in a protective circuit illustrated in FIG. 6.

However, it is noted that a series connection of the second zener diodes D2 including at least one second zener diode D2 connected in a reverse direction reduces the number of second zener diodes D2 necessary for allowing the sum of the forward rising voltages Vf2 thereof to be higher than the voltage V of the external power supply Vd, as compared with a series connection of the second zener diodes D2 in which all of the second zener diodes D2 are connected in the same forward direction.

First Modification

In the above-described preferred embodiment, the second zener diodes D2 are formed of the diffusion layers 5b, 5c and 6b which are arranged in stripes in plan view as illustrated in FIG. 3, in the protective circuit with the configuration illustrated in FIG. 1. As an alternative to this, the second zener diodes D2 can be formed of a p-type diffusion layer 5e and n+-type diffusion layers 6d and 6e which are arranged so as to be nested as illustrated in FIG. 7.

Figure 7:
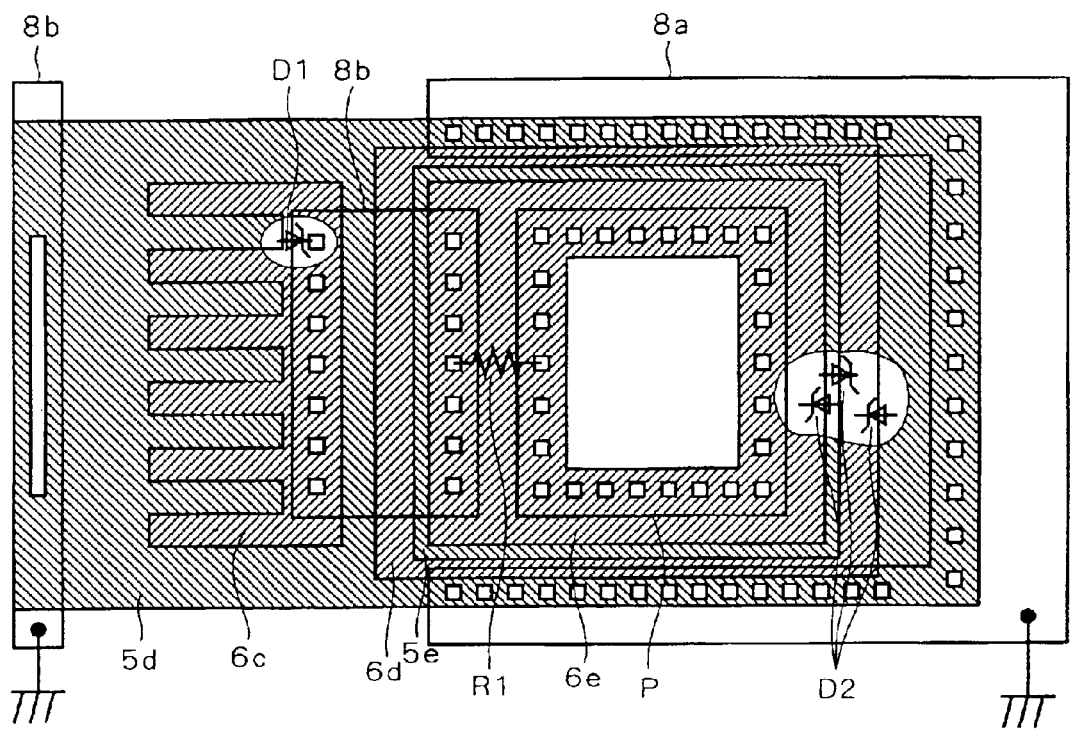
FIG. 7 is a plan view from above of a semiconductor device in which a protective circuit according to a first modification of the present invention is formed.

More specifically, as illustrated in FIG. 7, the n+-type diffusion layer 6e on which the external connection terminal P is formed and an n+-type diffusion layer 6c shaped like a comb and forms the first zener diode D1 are formed so as to be separated from each other.

Also, the p-type diffusion layer 5e and the n+-type diffusion layer 6d each in a shape of rectangular annulus are formed so as to alternately surround a periphery of the n+-type diffusion layer 6e on which the external connection terminal P is formed, thereby to form the plural second zener diodes D2 connected in series.

By configuring the outermost p-type diffusion layer 5d so as to surround also the n+-type diffusion layer 6c forming the first zener diode D1, the first zener diode D1 can be formed.

Moreover, the insulating film 7 is formed so as to cover the diffusion layers 5d, 5e, 6c, 6d and 6e in the foregoing arrangement. Also, contact holes extending through the insulating film 7 and respectively reaching predetermined ones of the diffusion layers 5d, 5e, 6c, 6d and 6e are formed. Each of the interconnects 8a and 8b and the external connection terminal P is formed by filling each of the contact holes with a conductor such as a metal in a predetermined pattern.

One of the interconnects 8b is formed so as to bridge the n+-type diffusion layer 6e on which the external connection terminal P is formed and the n+-type diffusion layer 6c shaped like a comb, thereby to form the resistor R1 connected between the external connection terminal P and the first zener diode D1 within the n+-type diffusion layer 6e on which the external connection terminal P is formed.

As described above, a plurality of pn junctions connected in series, i.e., the second zener diodes D2, are formed of an arrangement in which the p-type diffusion layer 5e and the n+-type diffusion layer 6d are nested and alternately surround the periphery of the n+-type diffusion layer 6e on which the external connection terminal P is formed. As a result, an area of the second zener diodes D2 is increased as compared with the configuration illustrated in FIG. 3, resulting in reduced internal resistance. Hence, it is possible to improve the voltage tolerance of the protective circuit to application of an overvoltage induced by a surge.

Second Modification

Figure 6:
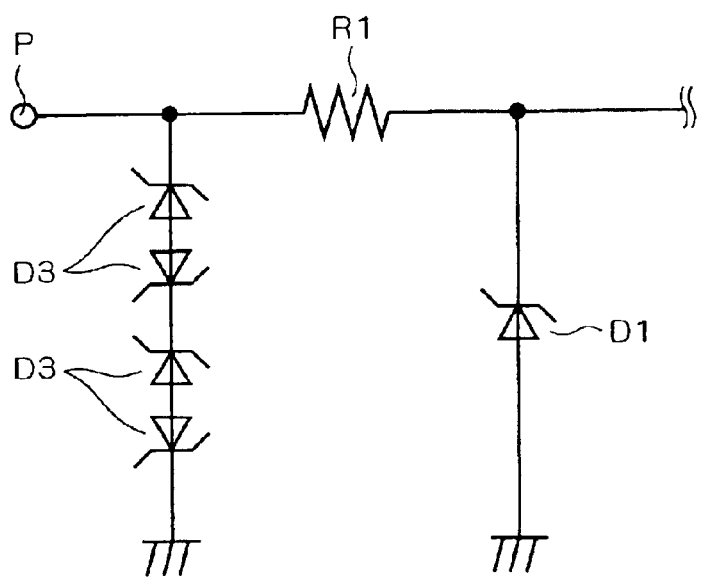
Figure 8:
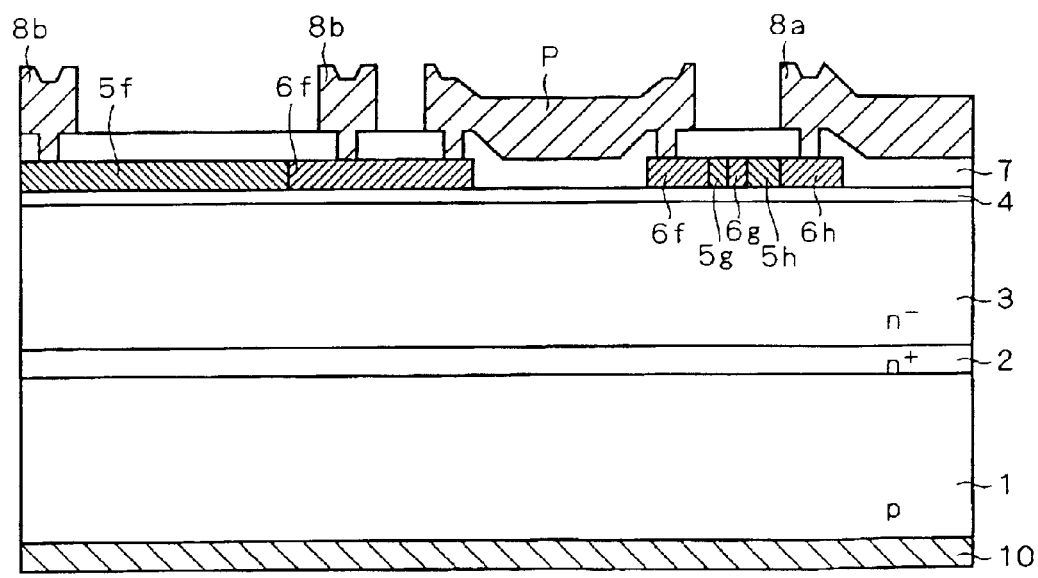
FIG. 8 is a sectional view of a portion of a semiconductor device in which an example of a protective circuit according to a second modification of the present invention is formed.
Figure 9:
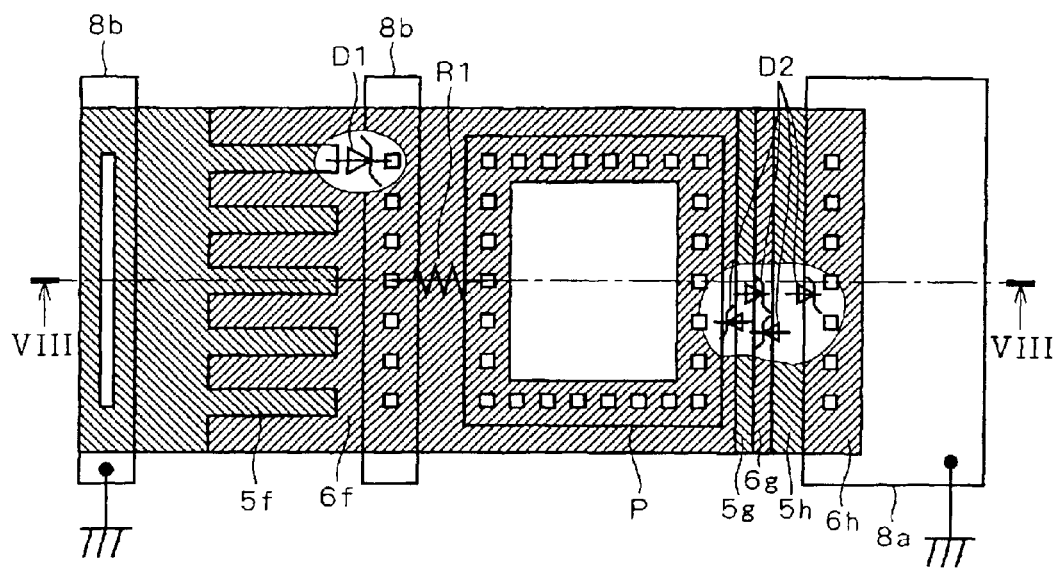
FIG. 9 is a plan view from above of the semiconductor device in which the example illustrated in FIG. 8 of the protective circuit according to the second modification of the present invention is formed.
Figure 10:
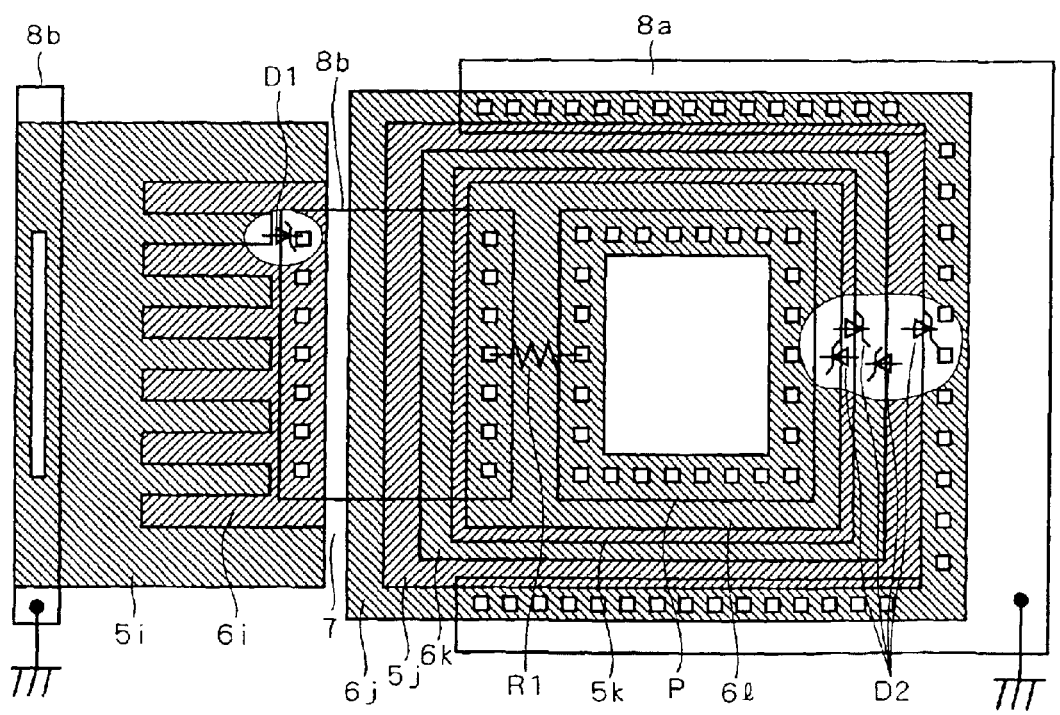
FIG. 10 is a plan view from above a semiconductor device in which another example of the protective circuit according to the second modification of the present invention is formed.
Figure 11:
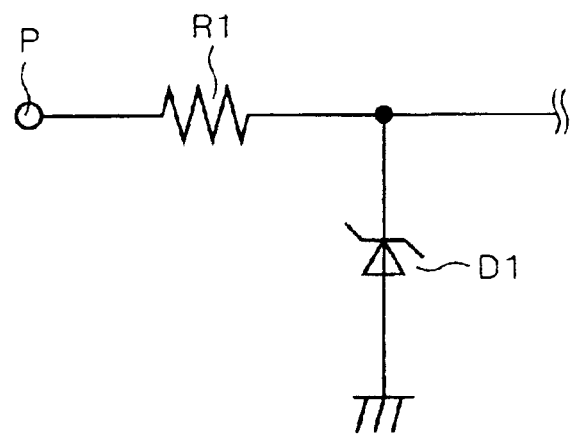
FIG. 11 is a circuit diagram of a conventional protective circuit.
Figure 12:
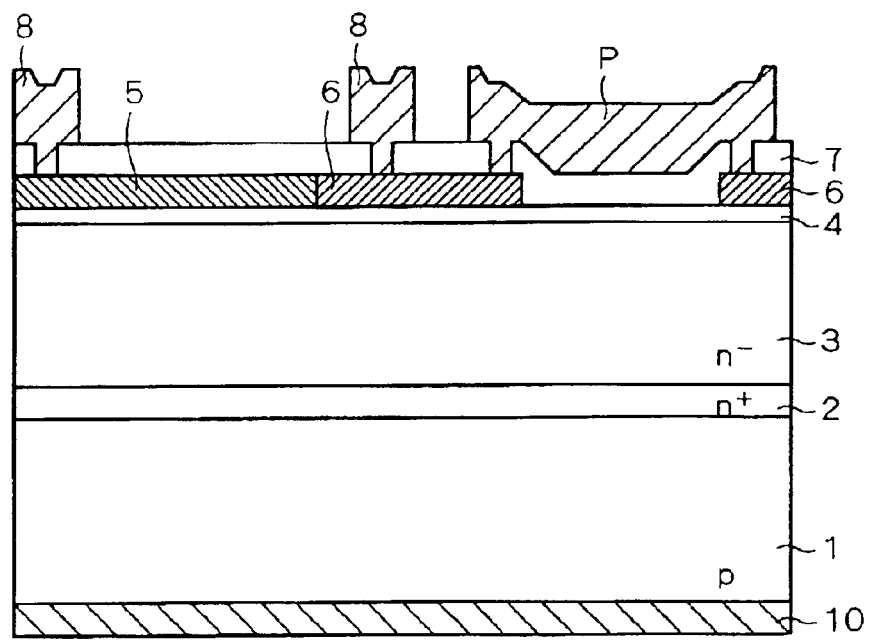
FIG. 12 is a sectional view of a semiconductor device in which the conventional protective circuit is formed.
Figure 13:
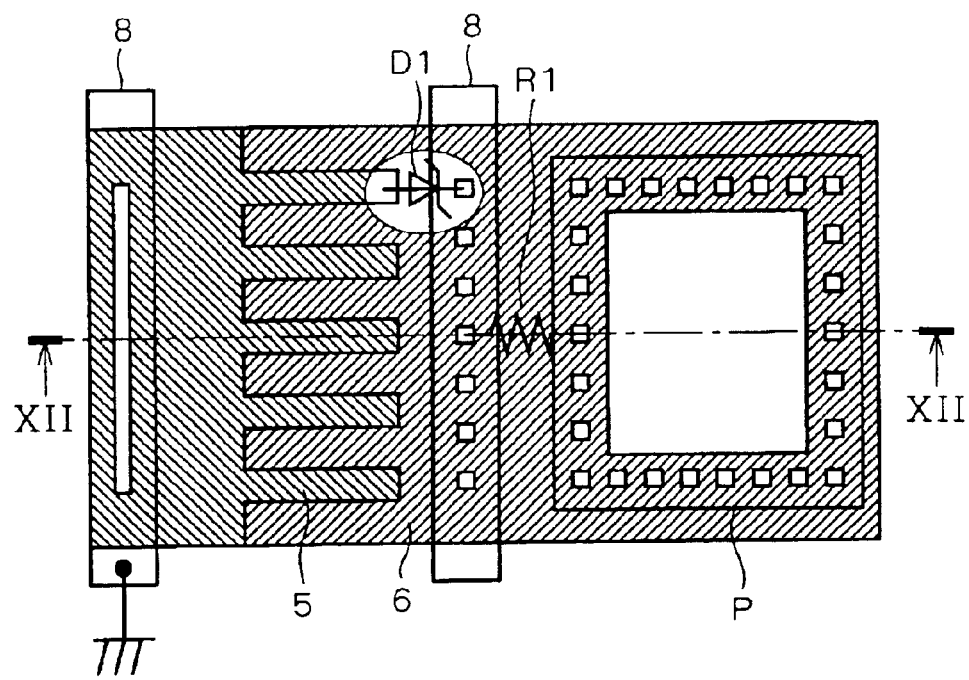
FIG. 13 is a plan view from above of a portion of the semiconductor device in which the conventional protective circuit is formed.
Figure 14:
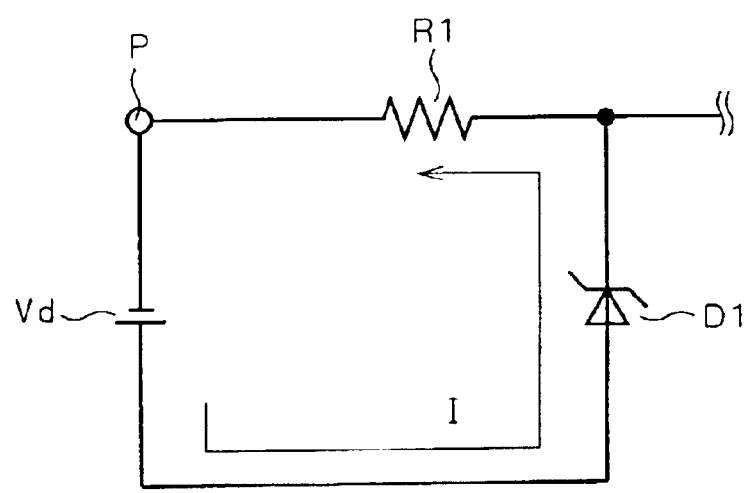
FIG. 14 is a circuit diagram for illustrating improper connection in which the conventional protective circuit is connected with an external power supply in a direction reverse to a normal direction.

In the protective circuit illustrated in FIG. 6, the plural pairs of the zener diodes D3 connected to each other in mutually opposed directions can be formed of the same number of p-type diffusion layers and n+-type diffusion layers. As illustrated in a plan view of FIG. 9 and a sectional view of FIG. 8 which is taken along a line VIII—VIII in FIG. 9, the plural pairs of the zener diodes D3 can be formed of p-type diffusion layers 5g and 5h and n+-type diffusion layers 6g and 6h which are alternately arranged in stripes while being adjacent to an n+-type diffusion layer 6f on which the external connection terminal P is formed, above the semiconductor substrate. The foregoing arrangement is analogous to that illustrated in FIGS. 2 and 3 associated with the protective circuit illustrated in FIG. 1. Alternatively, the plural pairs of the zener diodes D3 may be formed of another arrangement in which diffusion layers 5j, 5k, 6j, 6k and 61 are nested as illustrated in FIG. 10, in the same manner as in the first modification.

More specifically, the plural pairs of the zener diodes D3 connected to each other in mutually opposed directions may be formed of the same number of p-type diffusion layers (5j, 5k) and n+-type diffusion layers (6j, 6k) each in a shape of rectangular annulus which alternately surround a periphery of an n+-type diffusion layer 61 on which the external connection terminal P is formed.

The insulating film 7 is formed so as to cover the diffusion layers arranged in the foregoing manner. According to the second modification, the insulating film 7 is further formed between diffusion layers 5i and 6i forming the first zener diode D1 and the diffusion layers, 5j, 5k, 6j, 6k and 61 forming the pairs of the zener diodes D3, in order to avoid connection therebetween.

Moreover, contact holes extending through the insulating film 7 and respectively reaching predetermined ones of the diffusion layers are formed. Each of the interconnects 8a and 8b and the external connection terminal P is formed by filling each of the contact holes with a conductor such as a metal in a predetermined pattern.

One of the interconnects 8b is formed so as to bridge the n+-type diffusion layer 6i for forming the first zener diode D1 and the n+-type diffusion layer 61 on which the external connection terminal P is formed, thereby to form the resistor R1 connected between the external connection terminal P and the first zener diode D1 within the n+-type diffusion layer 61 on which the external connection terminal P is formed.

As described above, the plural pairs of the zener diodes D3 are formed of the p-type diffusion layers 5j and 5k and the n$^+$-type diffusion layers 6j and 6k which are arranged so as to be nested and alternately surround the periphery of the n$^+$-type diffusion layer 61 on which the external connection terminal P is formed. As a result, an area of each of the plural pairs of the zener diodes D3 is increased as compared with the configuration illustrated in FIG. 9, resulting in reduced internal resistance. Hence, it is possible to improve the voltage tolerance of the protective circuit to application of an overvoltage of a surge.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a semiconductor element formed on said semiconductor substrate; and
   a protective circuit configured to protect said semiconductor element and formed on said semiconductor substrate, comprising,
      a resistor having one end connected to an external connection terminal and another end connected to said semiconductor element,
      a first predetermined number of first zener diodes connected between said another end of said resistor and a constant potential node, said first predetermined number being greater than or equal to 1; and
      a second predetermined number of second zener diodes connected in series, between said one end of said resistor and said constant potential node, said second predetermined number being larger than said first predetermined number,
   wherein said second predetermined number of second zener diodes include a plurality of diffusion regions arranged to be nested in a plan view.

2. The semiconductor device according to claim 1, wherein said resistor, said first zener diodes and said second zener diodes are formed in a polysilicon layer formed on said semiconductor substrate.

3. The semiconductor device according to claim 1, wherein every two adjacent ones of said second zener diodes are connected in series in mutually opposed directions.

4. The semiconductor device according to claim 2, wherein every two adjacent ones of said second zener diodes are connected in series in mutually opposed directions.

* * * * *